(12) United States Patent
Garcia et al.

(10) Patent No.: US 11,171,435 B2
(45) Date of Patent: **\*Nov. 9, 2021**

(54) CABLE BUSHING

(71) Applicant: Eberspächer catem GmbH & Co. KG, Herxheim (DE)

(72) Inventors: Tobias Inclán Garcia, Wissembourg (FR); Nils Deuschel, Heuchelheim (DE); Thomas Gschwind, Bad Duerkheim (DE); Timo Wambsganss, Ruelzheim (DE)

(73) Assignee: Eberspächer catem GmbH & Co. KG, Herxheim (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/839,566

(22) Filed: Apr. 3, 2020

(65) Prior Publication Data

US 2020/0235508 A1    Jul. 23, 2020

Related U.S. Application Data

(62) Division of application No. 16/007,290, filed on Jun. 13, 2018, now abandoned.

(30) Foreign Application Priority Data

Jun. 14, 2017    (DE) ..................... 10 2017 210 005.2

(51) Int. Cl.
*H01R 12/75*    (2011.01)
*H01R 13/506*    (2006.01)
(Continued)

(52) U.S. Cl.
CPC .......... *H01R 12/75* (2013.01); *H01R 13/506* (2013.01); *H01R 13/5208* (2013.01);
(Continued)

(58) Field of Classification Search
CPC .... H01R 12/75; H01R 12/716; H01R 13/506; H01R 13/5208; H01R 13/5219;
(Continued)

(56) References Cited

U.S. PATENT DOCUMENTS 4,449,778 A    5/1984 Lane
5,608,611 A    3/1997 Szudarek et al.
(Continued)

FOREIGN PATENT DOCUMENTS

CN    105633718    6/2016
CN    206250455    6/2017
(Continued)

*Primary Examiner* — Tho D Ta
(74) *Attorney, Agent, or Firm* — Boyle Fredrickson S.C.

(57)    ABSTRACT

A cable bushing is disclosed for placement into a control housing surrounding a printed circuit board. The cable bushing includes a bushing housing comprising a locating surface, fastening means for fastening the bushing housing to the control housing, and retainers for at least two cables which are to be electrically connected to the printed circuit board. To facilitate the assembly of the cable bushing, the cable bushing housing is provided with contact elements that protrude from its front face, that are embodied to be adapted for plug contacting the printed circuit board, and that are electrically connected to the associated cables within the bushing housing. Also disclosed is the combination of a control housing and cable bushing and a printed circuit board housed in the control housing.

7 Claims, 9 Drawing Sheets

(51) Int. Cl.
*H01R 13/6592* (2011.01)
*H01R 43/00* (2006.01)
*H01R 43/20* (2006.01)
*H01R 13/52* (2006.01)
*H01R 24/22* (2011.01)
*H01R 13/648* (2006.01)
*H01R 13/6588* (2011.01)
*H05K 5/00* (2006.01)
*H01R 4/18* (2006.01)
*H01R 9/05* (2006.01)
*H01R 13/432* (2006.01)
*H01R 13/652* (2006.01)
*H01R 13/621* (2006.01)
*H01R 12/71* (2011.01)
*H05K 5/06* (2006.01)

(52) U.S. Cl.
CPC ....... *H01R 13/5219* (2013.01); *H01R 13/648* (2013.01); *H01R 13/6588* (2013.01); *H01R 13/6592* (2013.01); *H01R 24/22* (2013.01); *H01R 43/005* (2013.01); *H01R 43/20* (2013.01); *H05K 5/0069* (2013.01); *H01R 4/185* (2013.01); *H01R 9/0518* (2013.01); *H01R 12/716* (2013.01); *H01R 13/432* (2013.01); *H01R 13/5221* (2013.01); *H01R 13/6215* (2013.01); *H01R 13/652* (2013.01); *H01R 2201/26* (2013.01); *H05K 5/062* (2013.01)

(58) Field of Classification Search
CPC .............. H01R 13/648; H01R 13/6588; H01R 13/6592; H01R 24/22; H01R 43/005; H01R 43/20; H01R 13/6581; H01R 13/665; H01R 13/6215; H01R 13/74; H01R 12/712; H01R 24/30; H05K 5/0069
See application file for complete search history.

(56) References Cited

U.S. PATENT DOCUMENTS

| | | | |
|---|---|---|---|
| 6,948,971 | B2 | 9/2005 | Bartholoma et al. |
| 7,811,115 | B1 | 10/2010 | Tyler |
| 8,342,880 | B2 | 1/2013 | Kato et al. |
| 8,979,580 | B2 | 3/2015 | Bitzer et al. |
| 9,004,928 | B2 | 4/2015 | Tanaka et al. |
| 9,059,534 | B2 | 6/2015 | Endo et al. |
| 9,190,767 | B2 * | 11/2015 | Makimura ......... H01R 13/5219 |
| 10,164,352 | B2 | 12/2018 | Dendas et al. |
| 10,581,193 | B2 * | 3/2020 | Garcia ................ H02G 3/22 |
| 2004/0106325 | A1 | 6/2004 | Miyazaki |
| 2007/0054549 | A1 | 3/2007 | Sofker |
| 2013/0017720 | A1 | 1/2013 | Maegawa |
| 2018/0366851 | A1 * | 12/2018 | Garcia ............... H01R 13/6588 |

FOREIGN PATENT DOCUMENTS

| | | |
|---|---|---|
| DE | 20 2014 007 116 | 1/2016 |
| EP | 2 515 388 | 10/2012 |
| WO | 2014118389 | 8/2014 |

\* cited by examiner

CABLE BUSHING

CROSS REFERENCE TO RELATED APPLICATIONS

The present application is a division of U.S. patent application Ser. No. 16/007,290, filed Jun. 13, 2018, and entitled "Cable Bushing," the subject matter of which is incorporated herein by reference in its entirety.

BACKGROUND OF THE INVENTION

1. Field of the Invention

The present invention relates to a cable bushing disposed a control housing surrounding a printed circuit board. The cable bushing has, in a manner known per se, a bushing housing comprising a locating surface to abut against a control housing in a sealing manner, and preferably fastening means for fastening the bushing housing to the control housing. Furthermore, the bushing housing includes retainers for at least two cables to be electrically connected to the printed circuit board.

2. Description of the Related Art

Such a cable bushing usually has a bushing housing formed of plastics or another insulating material which is penetrated by retainers guiding the cable from the outside to the inside of the control housing. In prior art, the cable sheath of the cable within the bushing housing is partially removed, for example to expose a shielding of the cable in the region of the bushing housing and to electrically apply it to shield collars retained by the bushing housing and surrounding each cable circumferentially. The bushing housing usually has a groove recessed in the locating surface in which a sealing ring is inserted. Usually, a cable seal is assigned to the retainers so that the cable may be introduced into the control housing in a sealed manner to prevent environmental influences, in particular moisture, from penetrating into the control housing. The bushing housing furthermore comprises fastening means, usually in the form of through-holes by which the bushing housing may be fastened, in particular screwed, to the control housing.

Corresponding cable bushings are common in automotive engineering and they must meet the particular conditions all components installed in a vehicle are exposed to. These include considerable thermal fluctuations, loads due to vibration and dirt and moisture in the direct vicinity of those components provided with a separate control system.

SUMMARY OF THE INVENTION

The present invention provides a cable bushing for an electric heating device in a motor vehicle. The present invention considers the problem that such components are sometimes also installed in electric vehicles and operated at high voltages there. In this case, importance is placed on the shielding to obtain optimal EMC-protection. In the cable bushings known up to date, the cables are stripped inside the control housing and provided with terminals connected to the wires of the respective cables by crimping. These terminals must be connected inside the control housing which involves assembly efforts. The cables laid within the housing could moreover be squeezed during subsequent assembly operations within the control housing which can lead to cable breaks. Furthermore, care must be taken in high-voltage applications that the electrically conductive parts of the cables are laid with sufficient distances to other components. Moreover, air gaps and leakage paths which are to prevent any leakage current from flowing between the different polarities must be considered.

The previously known bushings do not fulfill these requirements sufficiently. The object underlying the present invention is to provide an improved cable bushing of the type mentioned in the beginning Here, the cable bushing according to the invention is to facilitate the assembly of the cable bushing at a control housing, wherein both a facilitation of the contacting between the individual cables and the conductors of the printed circuit board and an easier contacting of a shielding are to be provided.

To solve this problem, the present invention provides a cable bushing characterized by contact elements protruding from a front face of the bushing housing and embodied to be adapted for plug contacting with the printed circuit board and are electrically connected to the associated cables within the bushing housing. The cable bushing according to the invention may be correspondingly governed by the idea that a plug contact between the cables to be connected and the printed circuit board may be directly accomplished via the cable bushing. The contact elements are usually received in associated female plug contact elements which may be mounted on the surface of the printed circuit board or are provided inside the printed circuit board as is described in EP 2 236 330 and EP 2 897 230 A1, respectively. As a printed circuit board in the sense of the present invention, any plate-like, i.e. flat structure, is considered which is provided with electrically conductive paths. The printed circuit board may be equipped with components. However, it may also not be provided with corresponding components and only be embodied to be adapted for grouping heating circuits or for conducting control current and power current in one plane of the control housing. As a printed circuit board in the sense of the present invention, a printed circuit board as it is described in EP 2 505 931 A1 may also be considered. Such a printed circuit board basically consists of a plurality of bus bars held in an insulating frame. In this embodiment, too, the female plug contact elements are usually produced directly by punching and bending those strips forming the conductive paths of the strip conductor.

It will be appreciated that the bushing housing is preferably connected to the control housing in the solution according to the invention, too. For this, too, the bushing housing according to the invention preferably comprises bores for a threaded joint between the control housing and the bushing housing.

If the female plug contact elements are mounted on the surface of the printed circuit board and protrude from it, a mating surface assigned to the printed circuit board is usually provided against which the front face of the bushing housing abuts to fix it relative to the printed circuit board by abutment against the same. However, an embodiment where the front face directly abuts against the printed circuit board is preferred where accordingly the female plug contact elements are provided in the plane of the printed circuit board or on the back of the printed circuit board with respect to the cable bushing. In this case, the surface of the printed circuit board may be directly used for positioning and holding the bushing housing within the control housing.

Correspondingly, the front face of the bushing housing is usually embodied to be adapted for direct abutment against the printed circuit board. The front face may correspondingly have contours adapted to the contour of the printed circuit board. Preferably, the front face has positive locking elements cooperating with positive locking counter-elements of the printed circuit board to cause a poka-yoke function so that the bushing housing may be positioned relative to the printed circuit board only in one unique manner, and the individual contact elements may be contacted with the associated contact counter-elements of the printed circuit board.

The embodiment according to the invention usually requires that the front face is provided, in the extension direction of the cables, at a distance to the locating surface, since the printed circuit board is normally arranged at a distance to a housing wall of the control housing which is penetrated by the cable bushing and against which the cable bushing is mounted.

The front face of the bushing housing is preferably provided at a distance to a flange which forms, according to a preferred further development of the present invention, the locating surface and is preferably provided with a circumferential groove recessed in the locating surface and accommodating a sealing ring. The flange may be formed by a part of the bushing housing supporting the contact elements. However, the flange may also be formed by a bushing part of the housing through which the cables are guided in a sealed manner and which is formed separate of a retainer part which supports the contact elements and forms the front face. The bushing part itself may be formed by an elastic material to permit an optimal sealing of the cable and/or with respect to the housing wall of the control housing. If the nature of the material of the bushing part is appropriate, a separate sealing ring may be omitted, if the bushing part is formed of flexible plastics. The bushing housing is usually completely manufactured as a plastic component, in particular as a molded plastic part.

Preferably, at least one electrically insulating web extending between two contact elements protrudes from the front face. The latter is usually monolithically formed to the bushing housing. The corresponding web enlarges the leakage path and provides an air gap between the contact elements protruding from the front face. The web is usually received in a web retainer of the printed circuit board provided corresponding to it, whereby the leakage current path between the two contact elements is increased also in the region of the printed circuit board. This web retainer acts as a positive locking counter-element to the web and may correspondingly have a poke-yoke function. Preferably, a plurality of webs protrudes from the front face and preferably extend between the respective contact elements and require, apart from the above-described function of increasing the air gaps and leakage paths, moreover a unique spatial association of the bushing housing relative to the printed circuit board to create an electric contact between the contact elements and the corresponding strip conductors of the printed circuit board.

As in prior art, in the cable bushing according to the invention, too, there is a contacting to a shielding of the cable or cables. This shielding is always realized by a shielding plate comprising a shielding surface for contacting a shielding on the housing side. The shielding plate contacts the shielding of the cable or an outer shielding of a loom of cables accommodating several individually insulated cables. The shielding surface serves the contacting with a shielding on the housing side. This contacting may be accomplished, for example, by directly placing the shielding surface of the shielding plate against a mating surface of the shielding on the housing side. The shielding on the housing side may be formed, for example, by a surface of a metallic control housing or a shielding incorporated in the control housing, which may be introduced into a housing wall of the control housing, for example, by coating with plastics, while it is exposed in the region of the shielding surface.

Preferably, the shielding plate includes at least two crimp webs extending essentially at right angles with respect to the shielding surface and being connected to the cables. The connection between the crimp web and the corresponding cable may be a mechanical and/or an electrical connection. A plurality of crimp lugs may protrude from the crimp web to on the one side electrically contact a shielding of the respective cable and to thus connect the shielding plate to the shielding of the cable. Another crimp lug, however, may be placed around the cable sheath to only electrically connect the cable to the shielding plate for tension relief.

In the further development discussed here, the crimp webs protrude essentially at right angles from the shielding surface. The cables correspondingly penetrate the shielding surface, which may be provided between the cables and/or outside the cables, essentially at right angles. The shielding surface is preferably provided with a bore which is embodied to be adapted as a fastening retainer or female plug element retainer of an electric pin-and-socket connection. In case of a female plug element retainer, the connection between the shielding plate and a shielding on the control housing side, for example, may be accomplished via a pin-and-socket connection where a male plug element is fitted into the plug element retainer of the shielding surface. If the bore is provided as a fastening retainer, the shielding plate is usually provided with its shielding surface between two housing parts which form the supply housing and accommodate the shielding plate between them in this manner. Here, the bore may be penetrated by a clamping pin which is formed at one of the housing parts and connected with the other housing part, for example by gluing or warm calking into a retainer of the other housing part principally adapted to the clamping pin.

The fastening of the cables to the crimp webs having a predetermined orientation with respect to the shielding surface serves to facilitate the assembly. Thus, the cables may be initially connected to the crimp webs mechanically and/or electrically. Due to this connection, the cables and contact elements provided at the cable ends are pre-positioned. When the contact elements are being introduced into the bushing housing, accordingly only the shielding plate must be correctly positioned to introduce all cables with their corresponding contact elements into the bushing housing and position them there. To be fastened to the cable, the contact elements usually include crimp lugs known per se which may be connected to the cable sheath and/or an electrically conductive wire of the cable in an electrically conductive manner. Moreover, the contact elements usually include a latching nose for locking the contact element in a plug contact retainer recessed in the bushing housing. Thus, by pushing in the contact element or elements, the contact element and the corresponding cable are fixed relative to the bushing housing. Moreover, after the locking of the contact elements in the bushing housing by the latching noses, the movability of the contact element in the longitudinal direction of the cable is only possible to a limited extent so that the plug contacting of the bushing housing against the printed circuit board will reliably lead to an electric contacting of the respective contact element to the associated strip conductor of the printed circuit board.

According to a preferred further development of the present invention, a cable sealing element cooperating with a cable sheath of a cable in a sealing manner is provided which is connected to the shielding plate via a crimp lug monolithically formed at the crimp web. This preferred embodiment offers the possibility of first connecting the cable sealing element to the shielding plate via the crimp lug and to position it. After this intermediate assembly step, the bushing housing or a part thereof may be pulled over the cable to place an outer sealing surface on the housing side against the cable sealing element to introduce the cable into the bushing housing in a sealing manner. The prefixing of the cable sealing element via the crimp lug also facilitates this assembly step. The aspect discussed herein may also be essential for the invention per se. A cable bushing according to the invention comprises the features of the preamble and a shielding plate which comprises a shielding surface for contacting a shielding on the housing side and at least two crimp webs extending essentially at right angles thereto which are connected to the cables and each form at least one crimp lug which connects the respective cable sealing element to the shielding plate.

As was already mentioned above, the bushing housing may be embodied in two pieces with a retainer part supporting the contact elements and a bushing part sealing the cables. Here, the shielding plate is secured between the retainer part and the bushing part, usually clamped between them.

The shielding surface formed by the shielding plate is preferably connected to a contact surface in an electrically conductive manner which is exposed at a back of the bushing housing facing away from the locating surface for being connected to a shielding, in particular a shielding braid. The contact surface is preferably embodied by the shielding plate itself. In this embodiment, the contact surface usually extends, for being contacted with the shielding, at right angles to the main direction of extension of the locating surface and is formed out of a flat sheet material forming the shielding surface by punching and bending. The shielding plate always forms a plurality of contact webs prepared in this manner which are provided distributed on the circumference of the bushing housing at the back thereof so that a shielding braid pulled over the bushing housing on this side may be connected, for example by a cable fastener, both mechanically with the bushing housing and electrically with the shielding plate. The shielding or the shielding braid, respectively, usually abuts against a back of a flange which is embodied, preferably monolithically, at the bushing housing and supports, with its front side, the contact surface of the shielding plate and is protruded by the contact web or webs at its back. A part of the bushing housing protruding from the flange at the back is preferably formed by a housing projection. At the outer circumference of this housing projection, which usually extends essentially in parallel to the direction of extension of the cable, the contact web or webs are exposed. The housing projection serves the fastening of the shielding or the shielding braid.

To facilitate the manufacture of the cable bushing according to the invention, according to a preferred development of the present invention, a one-piece bushing housing body is suggested which comprises passages associated to the contact elements and extending from the front to the back. These passages each form, at the front side, contact retainers adapted for receiving the contact element, and at the back side, sealing retainers adapted for receiving a cable sealing element cooperating with a sheath of the cable. The front end of the passage is accordingly shaped corresponding to the contact retainers, the rear end corresponding to the sealing retainer. In this embodiment, both functionalities of the bushing housing, which are on the one hand the supporting and fixing of the contact element, and on the other hand the sealing of the cable, may be provided in one single unitary bushing housing body. A cap forming projections engaging the sealing retainers can be preferably latched with this bushing housing body. The projections are usually embodied as resilient projections. The projections cooperate with the cable sealing element received in the sealing retainer and press this element within the corresponding retainer so that a good sealing of the cable within the bushing housing body results.

BRIEF DESCRIPTION OF THE DRAWINGS

Further details and advantages of the present invention can be taken from the following description of exemplified embodiments in connection with the drawing. In the drawings.

DETAILED DESCRIPTION

Figure 1:
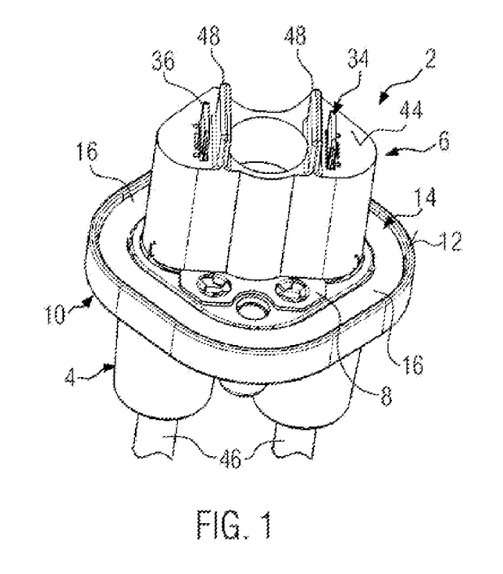
FIG. 1 shows a perspective side view of a first exemplified embodiment.

FIG. 1 shows a perspective side view of an exemplified embodiment of a cable bushing housing 2 for a cable bushing according to the invention. The cable bushing housing 2 is in the present case embodied in two pieces and has a bushing part 4 and a retainer part 6 which are connected to each other with the interposition of a shielding plate 8. The bushing part 4 forms a flange 10 which forms a locating surface 12 for placing it against a not represented control housing. The locating surface 12 is provided with a circumferential groove 14 into which a sealing ring 16 is inserted. The shielding plate 8 shown in a perspective view in FIG. 3 has several bores penetrating a flat shielding surface 18 of which one central bore is designated with reference numeral 20. The lateral bores designated with reference numeral 22 are shaped as female plug element retainers. The lateral fastening bores are provided on the opposite side and are designated with reference numeral 24. They are penetrated by tappets that penetrate the locating surface 12 and that are provided at the bushing part 4 and/or the retainer part 6, and they are fitted in associated bores of the respective other part to position both parts 4, 6 relative with respect to each other while enclosing the shielding plate. By this positive locking, a pre-positioning of the shielding plate 8 relative to one of the parts 4 or 6 may be effected to pre-assemble the shielding plate 8 at one of the parts 4, 6 and to then join the two parts 4, 6.

Figure 3:
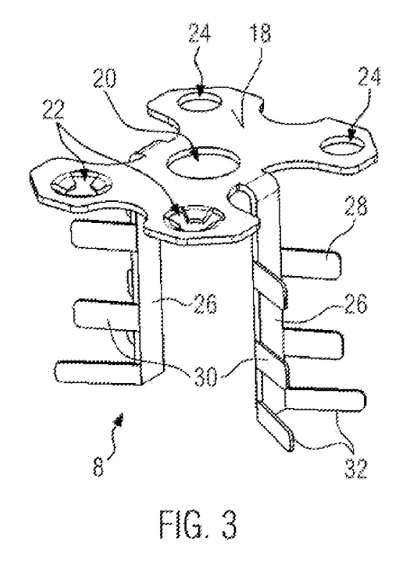
FIG. 3 shows a perspective side view of a shielding element of the first exemplified embodiment.

The shielding plate 8 forms two crimp webs 26 extending essentially at right angles to the shielding surface 18 and formed by punching and bending out of the initially flat material of the shielding plate 8. During this sheet processing, crimp lugs are moreover formed which protrude at right angles from the oblong crimp webs 26. Below, the individual crimp lugs will be discussed which are to this purpose designated with reference numeral 28 (first crimp lug), 30 (second crimp lug), and 32 (third crimp lug).

Figure 4:
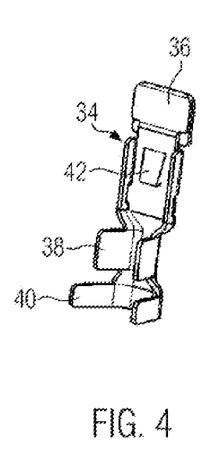
FIG. 4 shows a perspective side view of a contact element of the first exemplified embodiment.

Reference numeral 34 designates a male contact element in FIG. 4 which forms a contact tongue 36 at its front end. At the end opposite to the contact tongue 36, the contact element 34 has inner crimp lugs 38 and outer crimp lugs 40. Between this end of the contact element 34 on the fastening side and the contact tongue 36, a latching tongue 42 is cut free by punching and bending and bent out of the plane of the sheet material forming the contact element 24.

Figure 2:
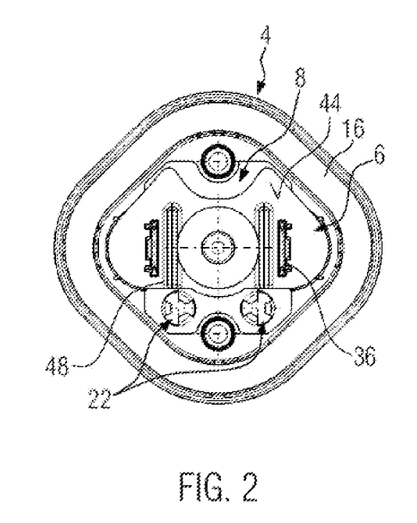
FIG. 2 shows a plan view onto the front side of the first exemplified embodiment.
Figure 5:
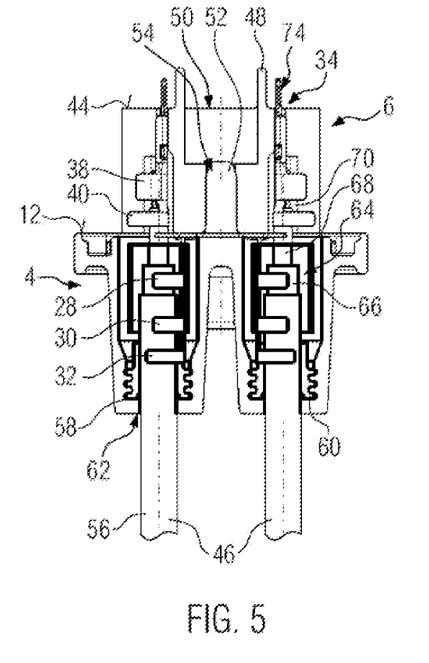
FIG. 5 shows a longitudinal sectional view of the first exemplified embodiment.

FIGS. 1, 2 and 5 show further details of the exemplified embodiment. The contact elements 34 obviously protrude, with their free ends, i.e. the contact tongues 36, from a front face 44 of the retainer part 6 and correspondingly form male contact elements for plug contacting the cable bushing housing 2 with a printed circuit board. Between the two contact tongues 36, in the longitudinal direction of extension of the contact elements 34 corresponding to the direction of extension of cables 46 which are each connected to the contact elements 34, webs 48 extend which are monolithically embodied at the retainer part 6 and protrude, in the longitudinal direction of extension, from the contact elements 4 (cf. FIG. 5). Between these two webs 48, the front face 44 is penetrated by a central bore 50 in which a clamping pin 52 is exposed which is provided monolithically at the bushing part 4 and projects through the locating surface 12. The clamping pin 52 is seated in a clamping pin retainer 54 which is recessed at the retainer part 6. The clamping pin 52 may be pressed on or glued within this clamping pin retainer 54. Equally, the clamping pin 52 made of plastic may be fixed in the clamping pin retainer 54 by warm calking. To this end, the bore 50 has an essentially larger diameter than the clamping pin retainer 54 or the clamping pin 52. At the opposite end of the cable bushing housing 2, there are, on a sheath 56 of the respective cables 46, elastomeric cable sealing elements 58 with an outer labyrinth seal. The inner diameter of the cable sealing elements 58 is adapted to the outer diameter of the cable sheath 56. In the joined state according to FIG. 5, the labyrinth seal, i.e. the sealing rings of the cable sealing element 58 provided at a distance, abut against an outer sealing surface 60 which is formed by the bushing part 4 and is provided adjacent to a cable bushing opening 62 at the rear end of the bushing part 4. The outer sealing surface 60 is conically broadened towards the retainer part 6 and passes over into a retainer space 64 for one of the crimp webs 26 each. In this receiving space 64, the cable 46 is connected to the shielding plate 8. To this end, the second crimp lugs 30 enclose the cable with its sheath 56 circumferentially. The first crimp lugs 28 circumferentially abut against a cable shielding 66 which is exposed by removing the cable sheath 56 and is protruded by an inner sheath 68 in the longitudinal direction of the cable 46 which surrounds an electrically conductive wire 70 of the cable. This wire 70 is also electrically connected with the inner crimp lug 38 by crimping. The outer crimp lugs 40 enclose the inner sheath 68 for the mechanical connection and tension relief between the contact element 34 and the associated cable 46. The third crimp lugs provided in pairs each enclose one sleeve section of the cable sealing element 58 which is provided upstream of the labyrinth seal in the axial direction and monolithically at the cable sealing element 58. Thereby, the cable sealing element 58 is fixed on the cable sheath 56 in the axial direction.

Figure 6A:
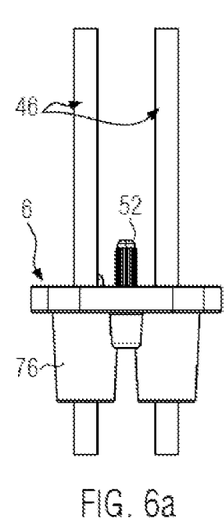
FIGS. 6a to 6i show perspective side views of different assembly steps in the manufacture of the first exemplified embodiment.
Figure 6B:
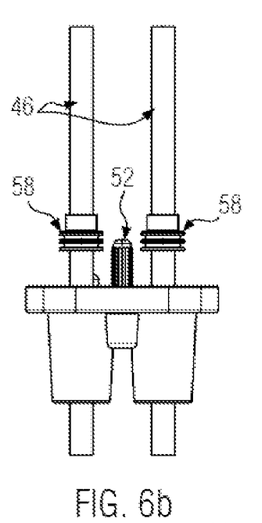
Figure 6C:
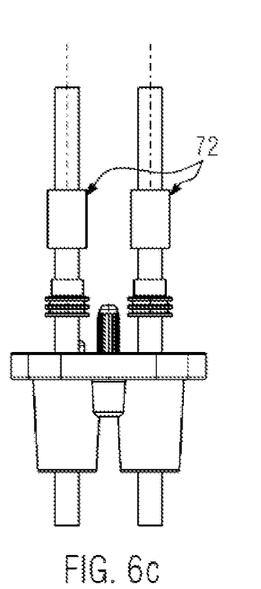
Figure 6D:
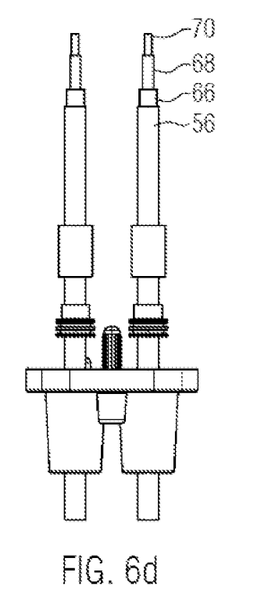

Below, the assembly of the exemplified embodiment is illustrated with reference to FIGS. 6a-j. First, the retainer part 6 is shifted over the cables 56 (FIG. 6a). Then, the cable sealing elements 58 are each shifted over the free ends of the cables 46 (FIG. 6b). Then, tubing pieces designated with reference numeral 72 are each pulled over the cable 56 from the free end (FIG. 6c). The free ends of the cables 46 are stripped to expose, on the one hand, the cable shielding 66 and, with an axial distance thereto, the wire 70 (FIG. 6d).

Figure 6E:
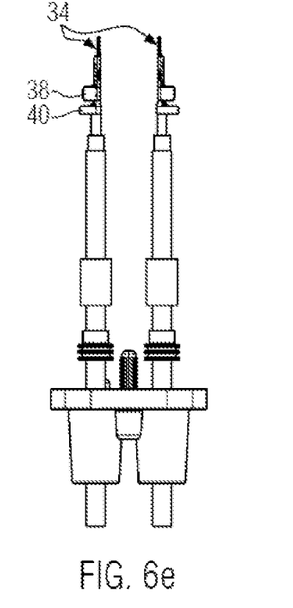

Then, the respective contact elements 34 are shifted over the free ends of the cables 46 and connected to them mechanically and electrically by crimping. This situation is represented in FIG. 6e. For a simpler representation, the outer and inner crimp lugs 38, 40 are still represented as protruding. It will be appreciated that at the end of the assembly, all crimp lugs will abut against a circumferential section of the cable 46 to be connected.

Figure 6F:
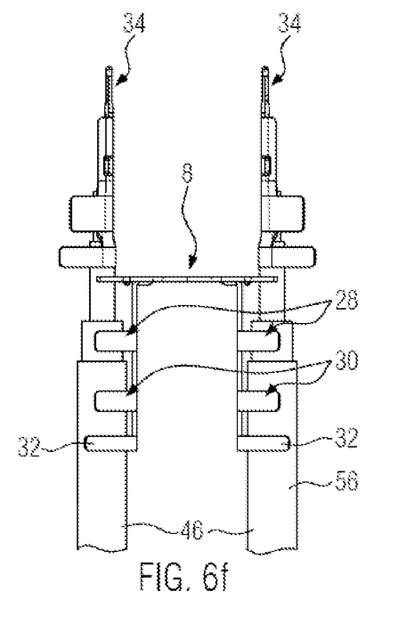

Then, the shielding plate 8 is connected to the cables 46. The second crimp lug 30 is placed against the cable sheath 56 as tension relief, the first crimp lug 28 is placed against the cable shielding 66 as shielding connection. During said crimping, the third crimp lugs 32 remain in their original state (cf. FIG. 6f).

Figure 6G:
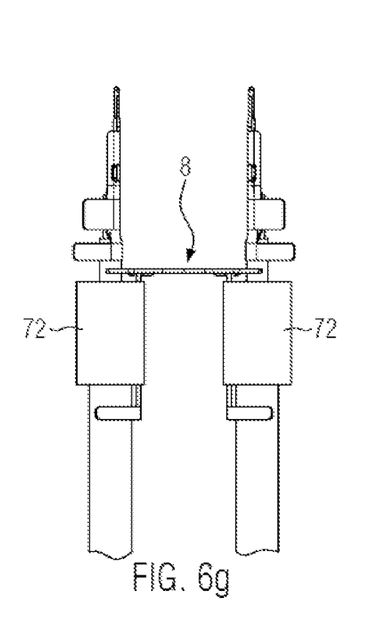
Figure 6H:
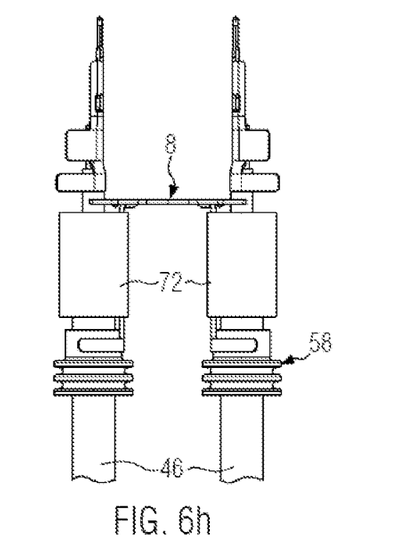

Now, the tubing pieces 72 are shifted up to the central piece of the shielding plate 8 forming the shielding surface 18 and shrunk onto it. Then, the tubing piece 72 covers the first crimp lugs 28 and the second crimp lugs 30 (FIG. 6g). The cable sealing elements 58 are now shifted along the cables 46 towards the shielding plate 8 until the labyrinth sealing basically abuts against the third crimp lugs 32. The third crimp lugs 32 are crimped to axially fix the cable sealing element 58 on the cable 46 (FIG. 6h).

Figure 6I:
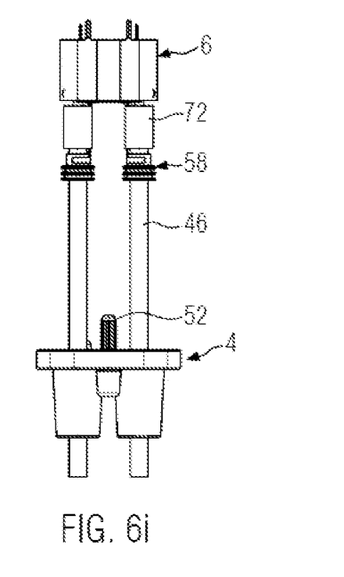

Due to the shielding plate 8 and the positioning by the crimp webs 26, the cables 46 and thus the contact elements 34 are pre-positioned relative with respect to each other. Thus, the retainer part 6 may be shifted, after a single positioning relative to the shielding plate 8, over the contact elements 34 which are introduced into contact retainers 74 recessed at the retainer part 6 in the process. During this movement, the latching tongue 42 latches against a mating surface of the retainer part 6 so that the contact elements 34 and thus the cables 46 are connected to the retainer part (FIG. 6i). Finally, the bushing part 4 is shifted, guided by the cables 46, against the retainer part 6 and placed against it. In the process, the clamping pin 52 first penetrates the central bore 20 of the shielding plate 8 and is finally received in the clamping pin retainer 54 of the retainer part 6 and fastened there in the manner as described above, for example by warm calking (FIG. 6i, FIG. 5). Finally, the sealing ring 16 is inserted into the groove 14.

In the finished product according to FIGS. 1, 3 and 5, the female plug element retainers 22 of the shielding plate 8 are located within the sealing ring 16 and outside a circumferential surface which is formed by the retainer part 6. Thereby, the shielding of the cable bushing housing 2 formed by the shielding plate 8, which is connected to the cable shielding 66 in an electrically conductive manner, may be plug-contacted within the control housing or at the same. It is also possible to provide contacting tappets at the outer side of the control housing which engage, when the bushing housing 2 is being fitted, the corresponding female plug element retainers 22 and are connected to them in an electrically conductive manner.

In the direction of extension of the webs 48 in front of and behind the bore 50, preparations 76 are visible in FIG. 6a which are provided at the bushing part 4 to guide further cables, apart from the two cables 46 provided for the power current, for example cables of an HV interlock, within the cable bushing housing 2 inwards into the control housing. These HV interlock cables, too, are preferably provided in the form of male plug elements protruding from the front face 44 of a retainer part facing away and may thus be connected to the printed circuit board by a pin-and-socket connection.

Figures 7, 8, 9, 10:
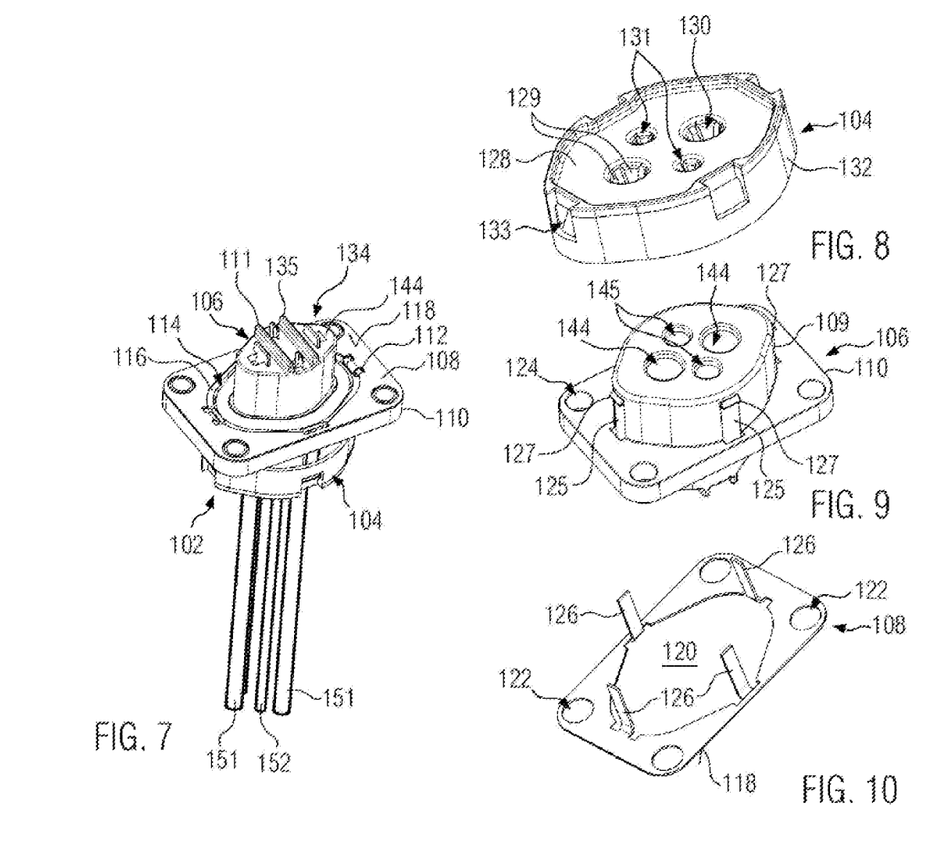
FIG. 7 shows a perspective side view of a second exemplified embodiment.
FIG. 8 shows a perspective plan view onto the housing cap of the second exemplified embodiment.
FIG. 9 shows a perspective plan view onto the bushing housing body of the second exemplified embodiment.
FIG. 10 shows a perspective plan view onto the shielding plate of the second exemplified embodiment.

The exemplified embodiment according to FIG. 7 et seqq. shows a corresponding embodiment.

In the exemplified embodiment according to FIG. 7 et seqq., a cable bushing housing 102 is formed by a housing cap 104 and a unitary bushing housing body 106 which are latched in the mounted state. The bushing housing body 106 supports a shielding plate 108 via a flange 110 monolithically formed at the bushing housing body 106 from the front face of which a housing projection 109 protrudes whose front face is protruded by webs 111 (FIG. 13h). The flange 110 forms a locating surface 112 to be placed against a control housing. This locating surface 112 is provided with a groove 114 which accommodates a sealing ring 116 which is provided within the shielding plate 108 (FIG. 7). To this end, a shielding surface designated with reference numeral 118 is penetrated by a central recess 120 which exposes the sealing ring 116 in the locating surface 112 (cf. FIG. 10). Moreover, the shielding plate 108 includes punched out holes 122 penetrating the shielding surface 118 which, in the mounted state, are aligned with lateral fastening bores 124 which represent examples of fastening means in the sense of the invention and are recessed at the flange 110 (cf. FIGS. 9, 10). Four contact webs 126, which essentially extend at right angles to the shielding surface 118, are bent out of the plane containing the shielding surface 118 by punching and bending. The outer side of the contact web 126 here forms a contact surface 126.1. To locate the contact webs 126, the housing projection 109 is provided with locating webs 125 which protrude from the convex circumferential surface of the housing projection 109 and are protruded by latching cams 127 (FIG. 9).

The housing cap 104 shown in FIG. 8 comprises projections 129 protruding forward from a cover surface 128 which are each slightly resiliently bound to the cover surface 128 and assigned to major openings 130 within the cover surface. Between these major openings 130, the cover surface 128 is furthermore penetrated by minor openings 131. A collar 132 of the housing cap 104 has, distributed at the periphery, four latching openings 133 in which the latching cams 127 are locked in the joined state; cf. FIG. 12.

The contact elements of the second exemplified embodiment are embodied to be identical with the contact elements of the first exemplified embodiment and are altogether designated with reference numerals 134, 135 and, with respect to their details, with reference numerals 136 to 142. Reference is made to the description to FIG. 4.

The bushing housing body 106 is made of an insulating plastic material and has four passages penetrating the bushing housing body 106 from the front to the back of which the major passages are designated with reference numeral 144, and the minor passages are designated with reference numeral 145. At the back visible in FIG. 9, the passages 144, 145 are embodied as sealing retainers which are designated in FIGS. 9 and 11 as large sealing retainers 146 and small sealing retainers 147. These sealing retainers 146, 147 are embodied to be adapted for receiving large and small cable sealing elements 148, 149 adapted in terms of size. The respective cable sealing elements 148, 149 have a labyrinth sealing structure with several axially spaced apart sealing beads. They are made of a flexible material. Their inner diameters are adapted to the outer diameter of a cable of which the cables conducting the power current are designated with reference numeral 151, and the cables assigned to the HV interlock circuit are designated with reference numeral 152. The large contact elements 134 are connected to the HV power cable 151, the small contact elements 135 to the HV interlock cable 152. The cables 151, 152 have a cable sheath 156 and a wire 160. In the present exemplified embodiment, they have no separate cable shielding.

Figure 11:
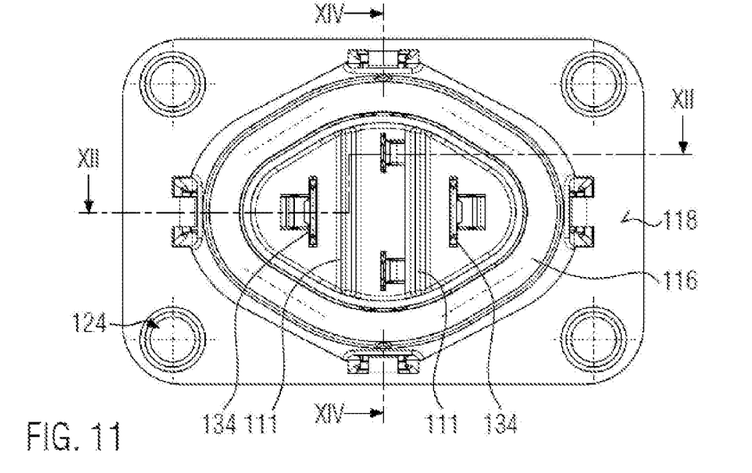
FIG. 11 shows a plan view onto the front side of the second exemplified embodiment.

As is illustrated in FIG. 11, the passages 144, 145 each have at the front side contact retainers 162 adapted for receiving the contact elements 134, 135. The small contact retainers designated with reference numeral 164 are assigned to the contact elements 135 to the HV interlock cables 152. These contact elements 166 are essentially embodied like the contact elements 134 and they also have inner and outer crimp lugs and a latching tongue punched free for locking in the bushing housing body 106. In this respect, too, reference can be made to the description of the contact elements 134. In the mounted state, the projections 129 engage the large sealing retainers 148 and cooperate with the cable sealing elements 152 provided there to press them within the sealing retainer 148 and increase the sealing effect. Such measures are not required for the sealing of the small cable sealing elements 149.

Figure 12:
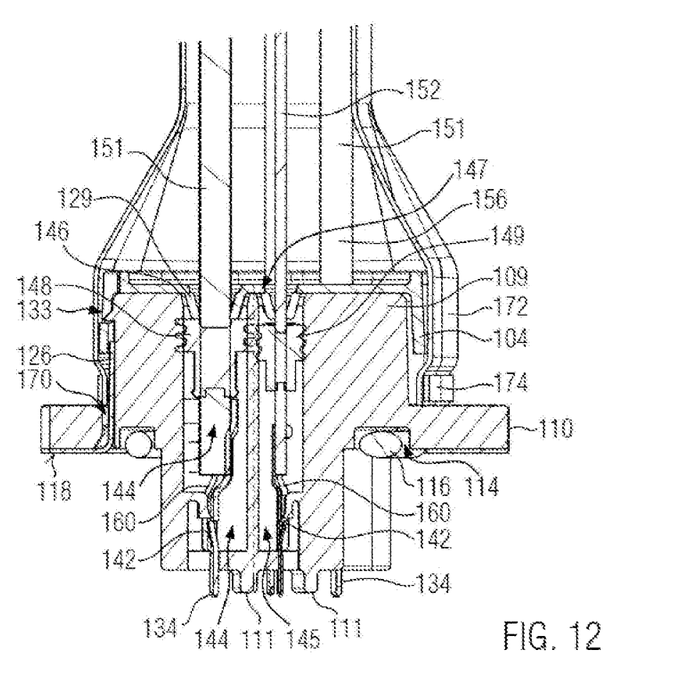
FIG. 12 shows a longitudinal sectional view of the second exemplified embodiment along line XII-XII according to FIG. 11.
Figure 13A:
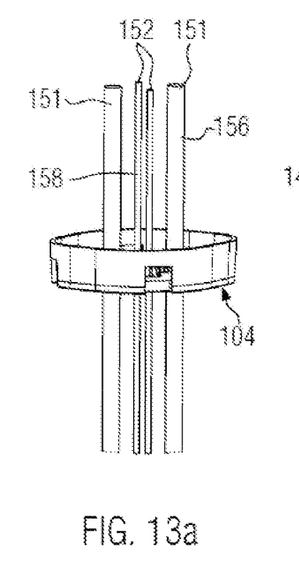
FIGS. 13a to 13j show perspective side views of different assembly steps in the manufacture of the second exemplified embodiment.
Figure 13B:
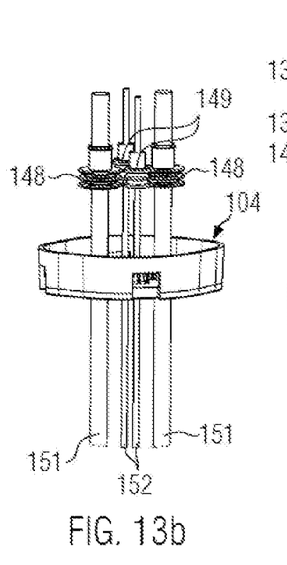
Figure 13C:
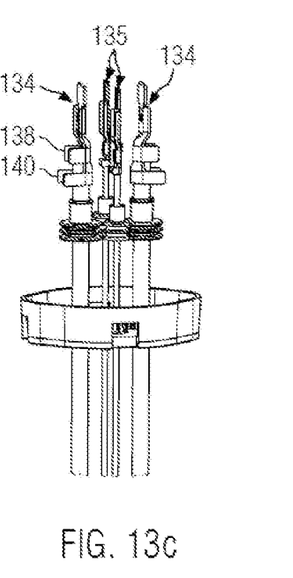
Figure 13D:
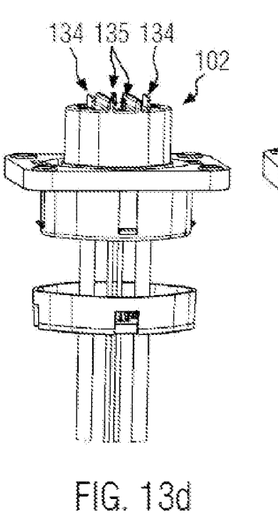
Figure 13E:
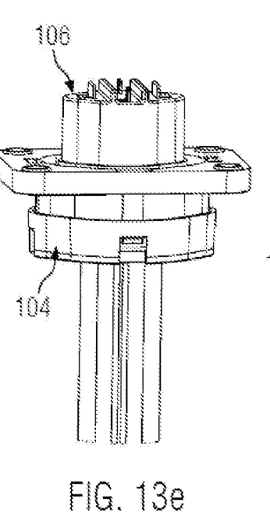
Figure 13F:
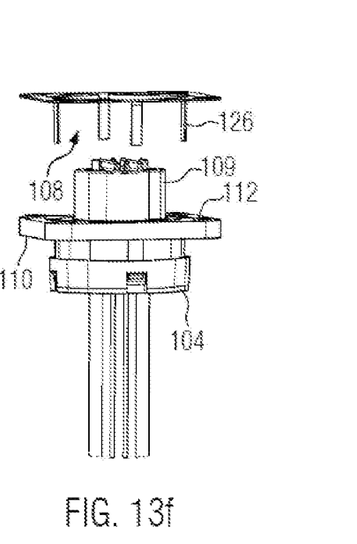
Figure 13G:
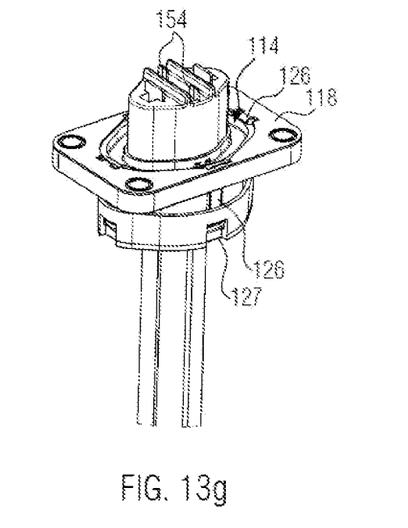
Figure 13H:
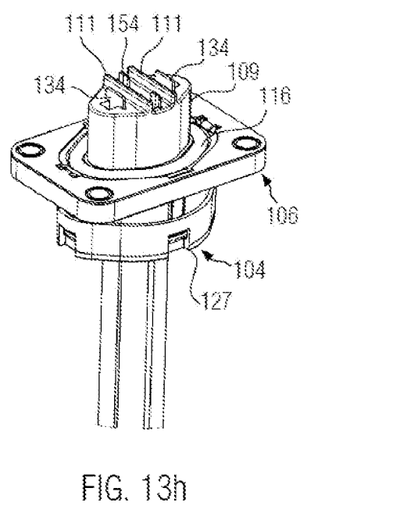
Figure 13I:
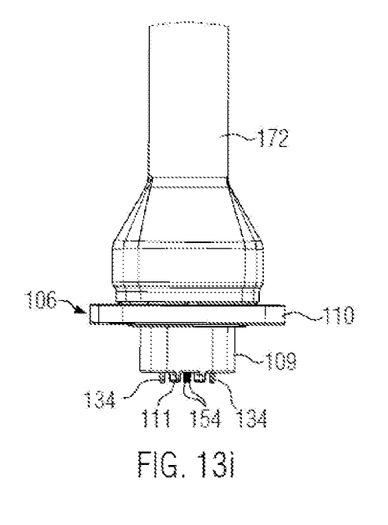
Figure 13J:
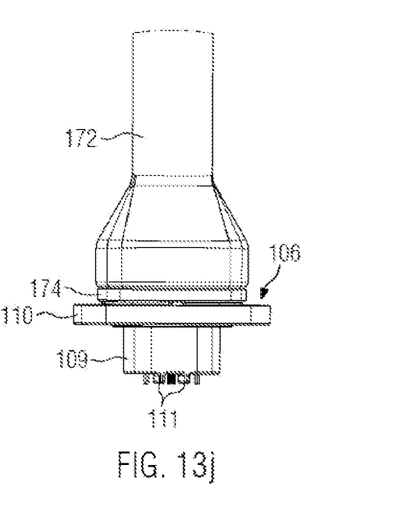

To assemble the exemplified embodiment, first the housing cap 104 is shifted over the cables 151, 152 (FIG. 13a). Then, the cable sealing elements 148, 149 are shifted over the cables 151, 152 (FIG. 13b). Now, the contact elements 134, 135 are connected to the cable sheath 156 of the respective cables 151, 152 mechanically via the outer crimp lug 140, and electrically via the inner crimp lug 138 by crimping (FIG. 13c). The contact elements 134, 135 are now shifted into the bushing housing body 106 (FIG. 13d). Then, the housing cap 104 is latched with the bushing housing body (FIG. 13e). From the opposite front side, the shielding plate 108 is now guided over a housing projection 109 of the bushing housing body 106 protruding from the flange 110 (FIG. 13f). In the process, the contact webs 126 penetrate contact web retainers 170 recessed at the flange 110 and are finally exposed at the outer periphery of the housing projection 109 distributed on the periphery (cf. FIGS. 12, 13f). The shielding surface 118 essentially covers the locating surface 112 which is formed by the flange 110. The groove 114 remains clear due to the central recess 120 (FIG. 13g). Now, the sealing ring 116 may be inserted (FIG. 13h). Finally, a shielding braid designated with reference numeral 172 is pulled over the housing projection 109 so that the inner periphery of the shielding braid 172 encloses the contact webs 126 (FIG. 13i). A cable fastener designated with reference numeral 174 fixes the shielding braid 172 against the housing projection 109 while enclosing and electrically contacting between the shielding braid 172 and the contact webs 126. Thus, a shielding guided from the outside to the inside is provided within the cable bushing housing 2 (FIGS. 12, 13j). At the other end of the shielding braid 172, an electric plug for plug contacting the control housing which is shielded while enclosing the shielding braid 172 may be provided.

In the mounted state, the contact elements 134, 135 protrude from the front face of the housing projection 109. The webs 111 extend between the contact elements 134 for the HV power current.

Figure 14:
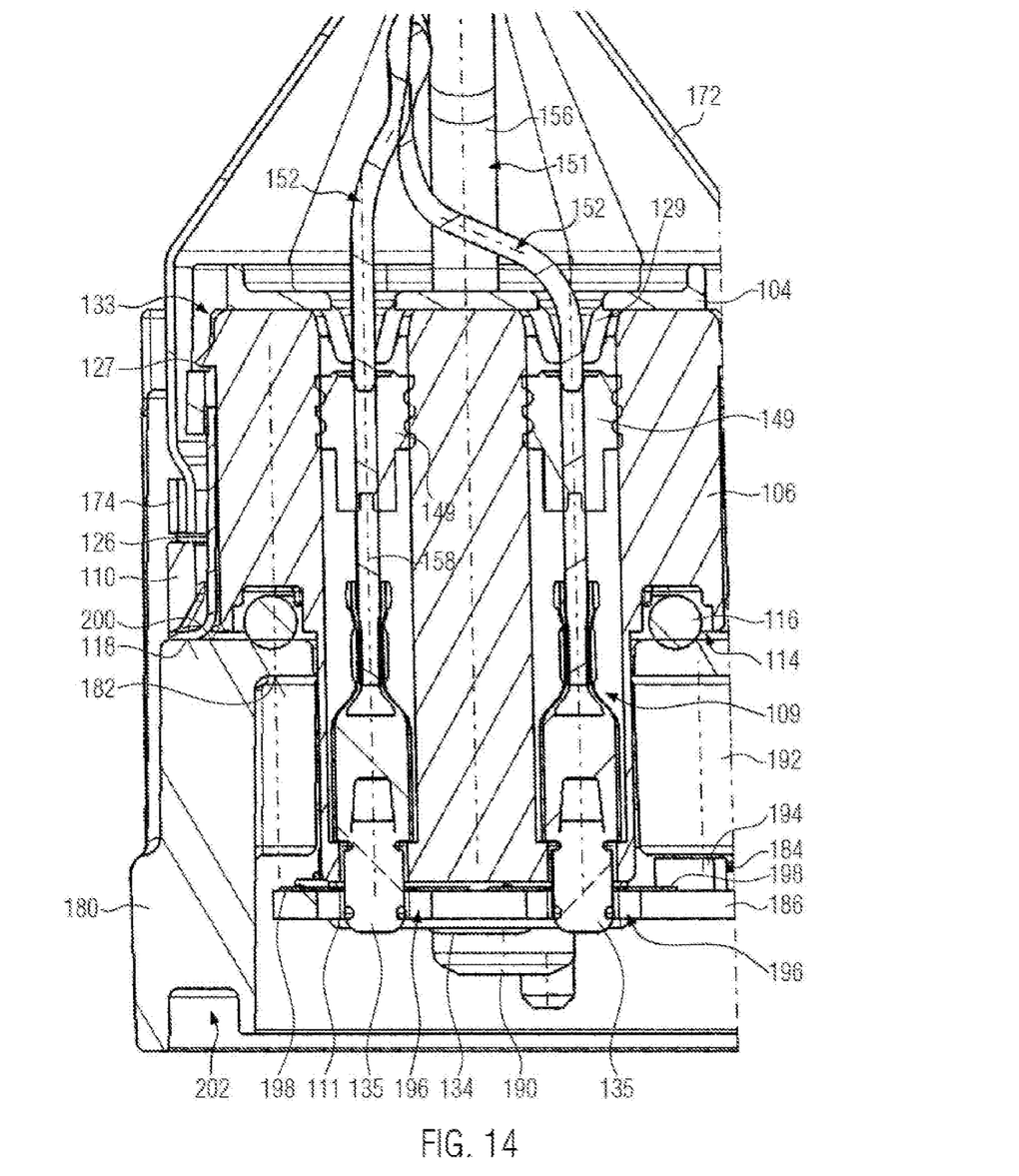
FIG. 14 shows a sectional representation along line XIV-XIV according to the representation in FIG. 11 for a cable bushing with a control housing element.

FIG. 14 shows a sectional view along line XIV-XIV according to the representation in FIG. 11 for the above described cable bushing in case of an assembly to a control housing element designated with reference numeral 180 which is embodied as a metallic housing shell. The control housing element 180 has several supporting cams 184 protruding from an inner surface 182 which are usually provided in corner regions of the control housing element 180 and support a printed circuit board 186 which is equipped with various components 190. The control housing element 180 furthermore forms at least one cooling projection 192 against which abuts a circuit breaker 194 generating stray power, normally with the interposition of an electrical insulation layer, the circuit breaker 194 being contacted via the printed circuit board 186.

The printed circuit board 186 has several recesses 196 which are equipped with female contact elements 198 which have spring tongues projecting into the recess 196 and are described in EP 2 236 330 A1. Via these female contact elements 198, the small and large contact elements 134, 135 are contacted with the printed circuit board 186. To this end, the respective contact elements 134, 135 are—as is demonstrated in FIG. 14—inserted through the recess 196 and project through the printed circuit board 186.

In the shown exemplified embodiment, the printed circuit board 186 is located at a small distance to the front face of the housing projection 109. The arrangement of the printed circuit board 186 with respect to the size of the control housing element 180 is selected such that the corresponding gap is observed when the flange 110 abuts against an outer surface 200 of the control housing element 180 with the interposition of the shielding surface 118, whereby the outer shielding of the cable is transferred via the shielding braid 172 to a control housing shielding formed by the metallic control housing element 180.

The control housing element 180 has a groove 202 surrounding at the free edge into which a projection of a housing lid may be introduced that can be placed onto the control housing element 180 in a sealing manner. Via an elastic adhesive introduced in the groove 202, a sealing to the housing lid may be achieved so that the printed circuit board 186 is accommodated in the control housing and protected from environmental influences.

What is claimed is:

1. Cable bushing for guiding cables into a control housing surrounding a printed circuit board, having a bushing housing comprising a locating surface, preferably fastening means for fastening the bushing housing to the control housing and retainers for at least two cables which are to be electrically connected to the printed circuit board, and contact elements protruding from a front face of the bushing housing which are embodied to be adapted for plug contacting with the printed circuit board and are electrically connected to the associated cables within the bushing housing, and a shielding plate which forms a shielding surface for contacting a shielding on a side of the bushing housing, characterized in that the shielding plate forms at least two crimp webs ex-tending at substantially right angles with respect to the shielding surface and connectable to the cables.

2. The cable bushing according to claim 1, characterized in that the cable bushing housing comprises a flange forming the locating surface and a circumferential groove in which a sealing ring is received is recessed in the locating surface.

3. The cable bushing according to claim 1, characterized in that at least one electrically insulating web extending between two contact elements protrudes from the front face.

4. The cable bushing according to claim 1, characterized in that the shielding surface is provided with at least one bore which is embodied to be adapted as fastening retainers or female plug element retainers of an electric pin-and-socket connection.

5. The cable bushing according to claim 1, characterized in that a cable sealing element cooperating with a cable sheath in a sealing manner is connected to the shielding plate via a crimp lug monolithically formed at the crimp web.

6. The cable bushing according to claim 1, characterized in that the cable bushing housing is formed in two parts with a retainer part supporting the contact elements, and a bushing part sealing the cables, and that the shielding plate is secured between the retainer part and the bushing part.

7. Control device for a motor vehicle, in particular an electric heating device, with the control housing surrounding the printed circuit board which is equipped with female plug contact elements, and a cable bushing according to claim 1, placed against the control housing in a sealing manner with its cable bushing housing, whose contact elements are received each in one of the female plug contact elements of the printed circuit board.

* * * * *